(12) United States Patent
Lyons et al.

(10) Patent No.: US 6,864,024 B1
(45) Date of Patent: Mar. 8, 2005

(54) REAL-TIME CONTROL OF CHEMICALLY-AMPLIFIED RESIST PROCESSING ON WAFER

(75) Inventors: Christopher F. Lyons, Fremont, CA (US); Bharath Rangarajan, Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 209 days.

(21) Appl. No.: 10/302,225

(22) Filed: Nov. 22, 2002

(51) Int. Cl.⁷ .............................. G03F 9/00; G03C 5/00; A61N 5/00
(52) U.S. Cl. ..................... 430/30; 430/311; 250/492.2
(58) Field of Search ................ 430/30, 311; 250/492.2; 396/611

(56) References Cited

U.S. PATENT DOCUMENTS

| | | | |
|---|---|---|---|
| 5,932,380 A | * | 8/1999 | Yaegashi et al. .............. 430/30 |
| 6,017,663 A | * | 1/2000 | Yaegashi et al. .............. 430/30 |
| 6,770,407 B2 | * | 8/2004 | Feke et al. ..................... 430/30 |

* cited by examiner

*Primary Examiner*—Christopher G. Young
(74) *Attorney, Agent, or Firm*—Amin & Turocy, LLP

(57) ABSTRACT

One aspect of the present invention relates to a system and method for controlling environmental acid scavengers in real time during pattern exposure of a chemically amplified resist-clad wafer. The system includes a semiconductor wafer comprising a chemically amplified resist layer formed over a substrate layer, wherein a first portion of the resist layer has been removed to expose an area of the substrate layer in order to form a probe area; an exposure system programmed to implement an exposure process to transfer a device pattern onto at least a second portion of the resist layer; and a monitoring system adapted to detect chemical signals about the probe area in order to control the integrity of the resist layer during the exposure process. The method involves feeding data back to the on-going exposure process in order to effect an immediate change in the process.

22 Claims, 7 Drawing Sheets

REAL-TIME CONTROL OF CHEMICALLY-AMPLIFIED RESIST PROCESSING ON WAFER

TECHNICAL FIELD

The present invention generally relates to processing a semiconductor substrate. In particular, the present invention relates to monitoring and controlling the integrity of a chemically amplified resist in real-time during semiconductor processing in order to enhance the effectiveness of the resist and to improve process control.

BACKGROUND ART

Achieving the objectives of miniaturization and higher packing densities continue to drive the semiconductor manufacturing industry toward improving semiconductor processing in every aspect of the fabrication process. Several factors and variables are involved in the fabrication process. For example, at least one and typically more than one photolithography process may be employed during the fabrication of a semiconductor device. Each factor and variable implemented during fabrication must be considered and improved in order to achieve the higher packing densities and smaller, more precisely formed semiconductor structures.

In general, lithography refers to processes for pattern transfer between various media. It is a technique used for integrated circuit fabrication in which a silicon slice, the wafer, is coated uniformly with a radiation-sensitive film, the photoresist, and an exposing source (such as optical light, X-rays, or an electron beam) illuminates selected areas of the surface through an intervening master template, the photoresist mask, for a particular pattern. The lithographic coating is generally a radiation-sensitized coating suitable for receiving a projected image of the subject pattern. Once the image is projected, it is indelibly formed in the coating. The projected image may be either a negative or a positive of the subject pattern. Exposure of the coating through the photoresist mask causes a chemical transformation in the exposed areas of the coating thereby making the image area either more or less soluble (depending on the coating) in a particular solvent developer. The more soluble areas are removed in the developing process to leave the pattern image in the coating as less soluble polymer. The resulting pattern image in the coating, or layer, may be at least one portion of a semiconductor device that contributes to the overall structure and function of the device.

Because the photoresist is used to form features on the semiconductor devices, the integrity of the photoresist must be maintained throughout the lithography process. That is, any flaw or structural defect which is present on a patterned photoresist may be indelibly transferred to underlying layers-during a subsequent etch process wherein the photoresist is employed.

An example of one type of photoresist is a chemically amplified resist (CAR). The CAR is a type of photoresist, typically used in deep ultraviolet (DUV) lithography, that relies on the catalytic action of a photo-generated acid during the post-exposure bake (PEB) process to alter the solubility of the exposed film. Since the acid catalyst is not consumed during PEB reaction, it can participate in multiple reaction cycles, thus providing an amplification mechanism.

However, environmental acid scavengers such as amine groups may be present in and/or around the processing chamber in which the CAR is processed and/or exposed. As a result, these acid scavengers may affect the acid catalyst concentrations thereby causing undesirable variations in the performance of the CAR.

SUMMARY OF THE INVENTION

The following presents a simplified summary of the invention in order to provide a basic understanding of some aspects of the invention. This summary is not an extensive overview of the invention. It is not intended to identify key/critical elements of the invention or to delineate the scope of the invention. Its sole purpose is to present some concepts of the invention in a simplified form as a prelude to the more detailed description that is presented later.

The present invention provides a system and method for controlling uncontrolled environmental factors on and/or around a wafer structure coated with a chemically amplified resist (CAR). More specifically, the system and method involve monitoring the presence of acid scavengers such as amine groups on and/or around the CAR-coated wafer which may compromise the integrity of the CAR coating while transferring a device pattern thereto. This is accomplished in part by employing a monitoring system to monitor and gather data about the CAR and its surrounding environment during the pattern transfer process.

For example, a small monitor site or probe area on the wafer may be created by removing a portion of the CAR layer following formation thereof. The probe area on the wafer facilitates monitoring for acid scavengers, fluctuations in acid concentrations at the parts-per-billion level as well as any other chemical signal which may indicate that the performance and/or integrity of the CAR coating is being or may potentially be compromised. The output generated in part by the probe area can be controllably fed back to the exposure system in real time in order to immediately adjust the exposure process and its components accordingly. As a result, critical dimensions of the device pattern may be maintained during the exposure process of the CAR coating despite the presence of any environmental acid scavengers and/or other chemical contaminants.

One aspect of the present invention relates to a system for controlling environmental acid scavengers in real time during pattern exposure of a chemically amplified resist-clad wafer. The system includes a semiconductor wafer comprising a CAR layer formed over a substrate layer, wherein a first portion of the resist layer has been removed to expose an area of the substrate layer in order to form a probe area; an exposure system programmed to implement an exposure process in order to transfer a device pattern onto at least a second portion of the CAR layer; and a CAR monitoring system adapted to detect chemical signals about the probe area in order to facilitate controlling the structural integrity of the resist layer during the exposure process.

Another aspect of the present invention relates to a method for controlling environmental acid scavengers in real time during pattern exposure of a CAR-clad wafer. The method involves providing a wafer having a CAR layer formed thereon; removing a first portion of the CAR layer to reveal a surface of the wafer in order to create a probe area; irradiating at least a second portion of the CAR layer in order to transfer a device pattern therein; and monitoring an exposure environment with respect to the CAR layer in order to determine the presence and amount of the chemical contaminants about the probe area to facilitate controlling the structural integrity of the resist layer during the device pattern transfer.

Yet another aspect of the present invention relates to a method for controlling environmental acid scavengers in real time during pattern exposure of a CAR-clad wafer. The method involves providing a wafer having a CAR layer formed thereon; removing a first portion of the CAR layer to reveal a surface of the wafer in order to create a probe area; performing an on-going exposure process to at least a second portion of the CAR layer by irradiating the at least a second portion of the CAR layer in order to transfer a device pattern therein; monitoring an exposure environment with respect to the CAR layer in order to determine a presence and amount of chemical contaminants about the probe area and to generate data relating thereto to facilitate controlling the structural integrity of the resist layer during the device pattern transfer, and feeding the generated data back to the on-going exposure process in real time via feedback control in order to effect one or more immediate changes in the on-going exposure process.

DISCLOSURE OF INVENTION

Figure 1:
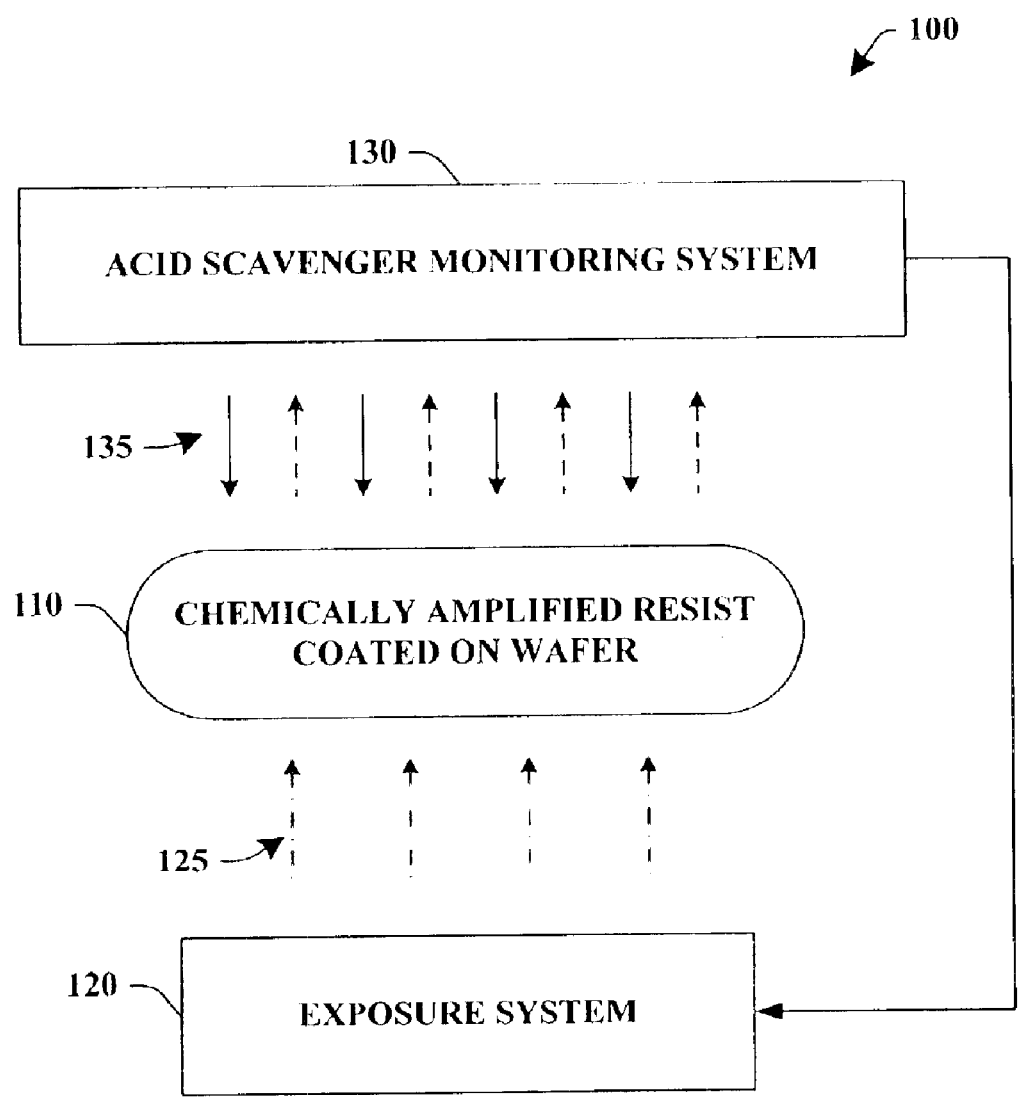
FIG. 1 illustrates a high-level schematic block diagram of a system for controlling environmental acid scavengers during an exposure process for a CAR-coated wafer in accordance with an aspect of the present invention.

The present invention involves a system and method for controlling uncontrollable environmental factors on and/or around a wafer structure coated with a chemically amplified resist (CAR) while the CAR coating is subjected to an exposure process. In particular, the system and method involve monitoring acid as well as other chemical concentrations in connection with the CAR in real time as the exposure process occurs. The real time monitoring of the chemical levels allows one or more aspects of the exposure process to be adjusted in accordance with the detected levels as it relates to and materially affects the CAR coating. Other chemical levels which may indicate that the structure or integrity of the CAR coating may be adversely compromised can also be detected and monitored.

Since the CAR relies on the catalytic action of a photo-generated acid during the post-exposure bake (PEB) process to alter the solubility of the exposed film, uncontrolled environmental factors such as acid scavengers may undesirably consume the photo-generated acid catalyst. Consequently, an insufficient concentration of acid may remain, thereby hindering the alteration of the solubility of the exposed film. In short, the transfer of the device pattern to the CAR and the specific critical dimensions associated therewith may be affected in an undesirable manner.

The system and method of the present invention is accomplished in part by employing a CAR monitoring system during as well as after the CAR-coated wafer is subjected to an exposure process (e.g., for transferring a device pattern thereto). For example, a small area of the wafer is exposed after the CAR has been coated thereon to create a monitor site or probe area. The monitoring system monitors and detects for chemical signals in, near and/or about the probe area of the wafer in order to determine the presence of environmental acid scavengers and other chemical contaminants which may affect the structural and/or physical integrity of the CAR. The CAR monitoring system may utilize an ellipsometry system and/or infrared and/or ultraviolet spectroscopy systems in order to obtain data output from the probe area. The data output may correspond to chemical concentration levels and/or any other chemical signal present in, on and/or around the probe area. For example, the monitoring system may detect amounts or concentrations of acid and acid scavengers which are present in the proximity of the probe area.

Data collected from the probe area can be communicated to a processor for analysis in order to determine whether adjustments to the exposure process and system are necessary in order to maintain the structural integrity and performance of the CAR coating during the exposure process. Adjustments may be made to one or more exposure components according to the output data obtained from the probe area as well as the analyzed data generated by the processor.

Because the CAR monitoring system operates in real time coincidentally with the operation of the exposure system and process, any data or information gathered or generated by the monitoring system about the probe area may be fed back in a controlled manner to the exposure system and process. Such data or information may be fed back in the form of analyzed data, raw data, modifications and/or a combination thereof to the exposure system parameters and corresponding components. The high sensitivity of the CAR monitoring system allows detection of chemical concentrations at a parts-per-billion level. As a result, the exposure system and process can be controlled in real time in order to respond to even discreet environmental fluctuations which may adversely affect the CAR during the exposure process.

Furthermore, the exposure environment, which may include an area around and/or about the CAR layer, and in particular, the probe area on the CAR layer may be monitored at least one time during the exposure process. Likewise, data may be collected and analyzed therefrom at least one time. Because the monitoring system can continuously monitor and collect data over the course of the exposure process and provide related information to the exposure process in real time, an overview of the status of the CAR layer during the exposure process may be obtained. This may be advantageous and useful in order to observe trends or cyclical behavior in the exposure process from wafer to wafer.

Moreover, the real time monitoring and feedback mitigates undesirable deviations in the pattern transfer process due to wafer-to-wafer variations and the like. The present invention will now be described in further detail using the exemplary FIGS. 1–7. These figures are merely exemplary of one or more aspects of the present invention.

FIG. 1 illustrates a high-level schematic block diagram of a system 100 for controlling environmental acid scavengers in real time during a pattern exposure process of a CAR layer. In particular, the system 100 includes a wafer 110 having a CAR layer formed thereon. An exposure system 120 may be initiated in order to effect a transfer of a device pattern onto the resist layer 110. The pattern transfer may be accomplished in part by irradiating at least a portion of the resist layer 110 as shown by arrows 125.

As the exposure system 120 carries out the pattern transfer, an acid scavenger monitoring system 130 can be employed to monitor the chemical environment around the resist layer 110. The monitoring may be demonstrated by arrows 135 which demonstrate that information (e.g., light) may be directed at the resist layer and received from the resist layer by the monitoring system 130. As information is received from the resist layer 110, it can be processed and analyzed within the monitoring system 130 to generate output data. This output data may relate to the chemical environment of the resist layer in its current state in real time during the pattern transfer process. The monitoring system 130 can feed back the generated output data to the exposure system 120 in order to implement adjustments to one or more aspects of the exposure system. The adjustments are dependent upon the generated output data and are reflective of the current chemical environment of the resist layer 110 in that the adjustments may directly result from the presence of an acid scavenger. Thus, for example, an adjustment may need to be made in order to accommodate for an increase in amine groups in the exposure environment in order to preserve and maintain the structural and/or physical integrity of the resist layer 110 during the pattern transfer.

Figure 2:
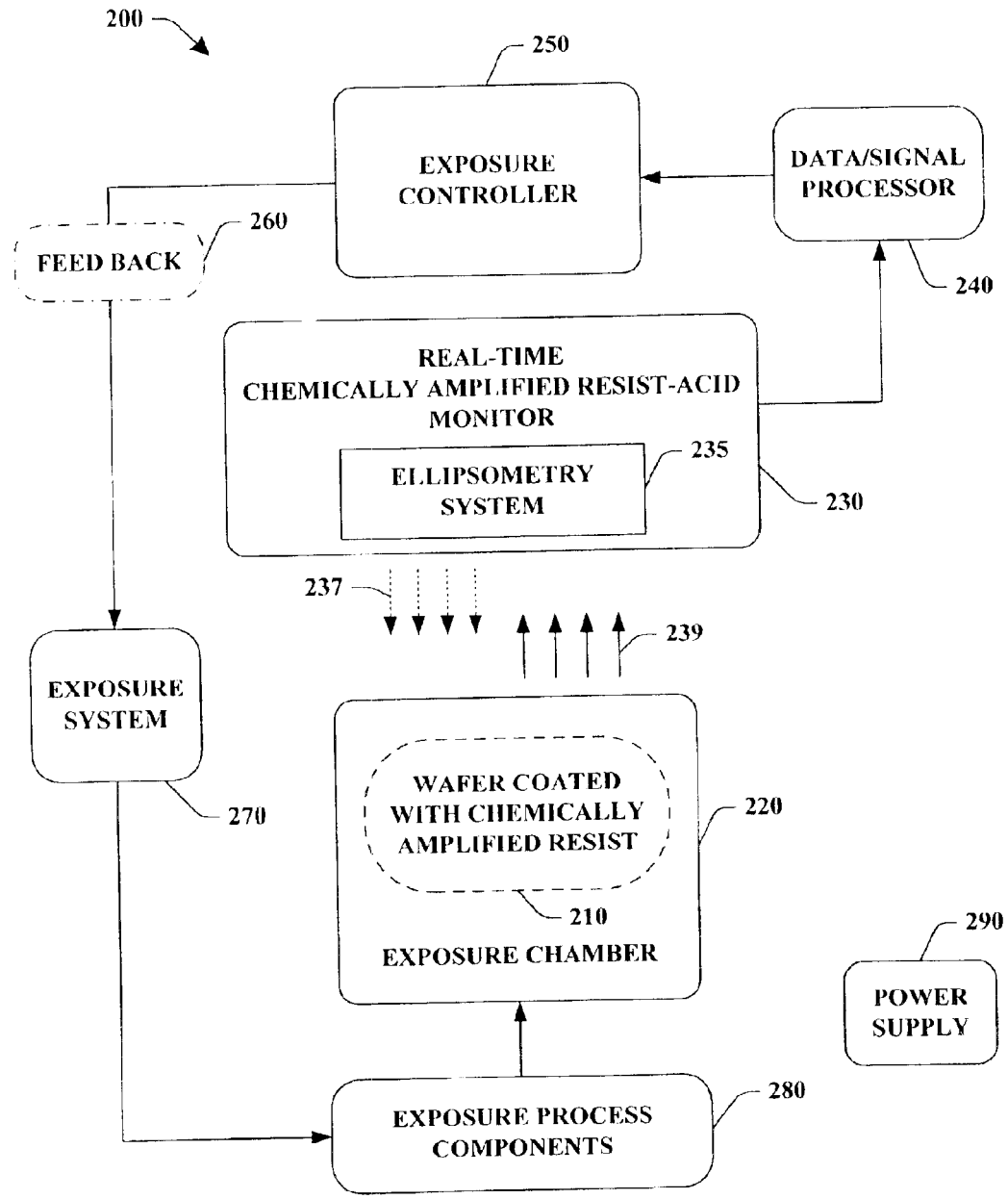
FIG. 2 illustrates a schematic block diagram of a system for controlling environmental acid scavengers during an exposure process for a CAR-coated wafer in real time in accordance with an aspect of the present invention.

FIG. 2 illustrates a schematic block diagram of a system 200 adapted to control the effects of environmental factors on a CAR layer progressing through an exposure process. The system 200 includes a wafer coated with a CAR layer 210. The wafer may be placed or positioned within an exposure chamber in preparation for and during the exposure process. As the exposure process progresses to transfer a device pattern onto the CAR-clad wafer 210, a real-time CAR-acid monitor may be employed in order to monitor the resist-clad wafer and in particular, its chemical environment. This is done in order to mitigate the presence of acid scavengers which may adversely affect the structural/physical characteristics of the resist layer. Examples of adverse affects include poor critical dimensions on the resist and an improperly patterned resist, both of which may result in an inoperable device.

The monitor 230 may utilize an ellipsometry system 235, for example, in order to facilitate detection of chemical signals at, near, and/or around the resist-clad wafer 210. The ellipsometry system may direct one or more beams of light 237 from one or more light sources (not shown) at the resist-clad wafer 210. In particular, the light 237 may be directed to a probe area of the resist-clad wafer 210. The probe area can be formed by removing a first portion of the resist from the wafer in order to expose the wafer surface. Chemical signals in the form of reflected light 239 may be received from the probe area and to the ellipsometry system 235. Such chemical signals can then be processed and analyzed by a data/signal processor 240 or by a processor internal to the monitor 230.

The processor 240 generates output data relating to the chemical signals detected by the monitor 230. The chemical signals may indicate or suggest a current state of the environment in and/or around the probe area and on the resist, in general. This information may be communicated to an exposure controller 250 which controls the exposure system 270 by providing feedback information 260 to it in real time rather than after the exposure process has been completed. Hence, the feedback information 260 corresponds to the current state of the resist during the exposure process.

According to the feedback 260, one or more adjustments may be made by the exposure system 270 to one or more exposure process components 280. Such adjustments are immediately implemented so that exposure process for the resist-clad wafer 210 is immediately modified in order to maintain the accurateness and effectiveness of the pattern transfer process onto the resist-clad wafer 210. Likewise, the critical dimensions and feature formation on the resist may also be preserved despite the presence of acid scavengers in the exposure system environment.

Figure 3:
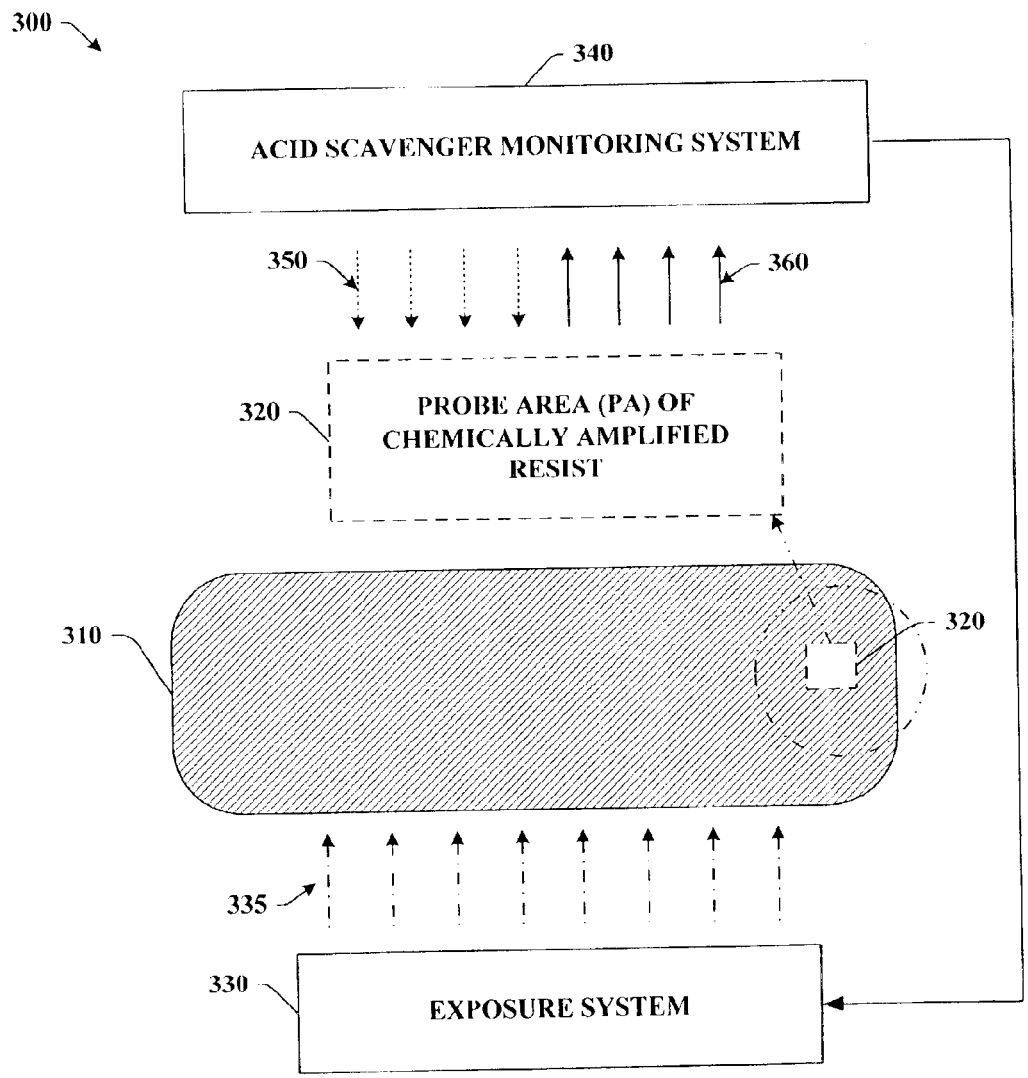
FIG. 3 illustrates a schematic block diagram of a system for controlling environmental acid scavengers during an exposure process for a CAR-coated wafer in real time in accordance with an aspect of the present invention.

FIG. 3 illustrates a system 300 for controlling environmental acid scavengers in real time during a pattern exposure process of a CAR layer. In particular, a wafer 310 having a CAR layer formed thereon. A first portion of the resist layer 310 may be removed in order to create a probe area 320 to facilitate the monitoring process. Following removal of a first portion of the resist layer 310, an exposure system 330 may be initiated in order to effect a transfer of a device pattern onto the resist layer 310. The pattern transfer may be accomplished in part by a irradiating a second portion of the resist layer 310 as shown by arrows 335.

As the exposure system 330 carries out the pattern transfer, an acid scavenger monitoring system 340 may monitor the chemical environment around the resist layer, and in particular, about the probe area 320 of the resist layer 110. The monitoring may be in a continuous manner or at timed intervals and can occur coincidentally and currently in real time with the exposure process. Such monitoring is demonstrated by arrows 350, 360 which depict that information is directed at the resist layer (350) and received from the resist layer (360) by the monitoring system 340. As information is received from the probe area 320, it can be processed and analyzed within the monitoring system 340 to generate output data. This output data may relate to the chemical environment of the resist layer in real time during the on-going pattern transfer process. The monitoring system 340 can feed back the generated output data to the exposure system 330 in order to implement adjustments to one or more aspects of the exposure system. The adjustments are dependent upon the generated output data and are reflective of the current chemical environment of the resist layer 310 (320) in that they may directly result from the presence of an acid scavenger. Thus, for example, an adjustment may need to be made in order to accommodate for an increase in amine groups in the environment of the exposure system in order to preserve and maintain the structural and/or physical integrity of the resist layer 310.

Figure 4:
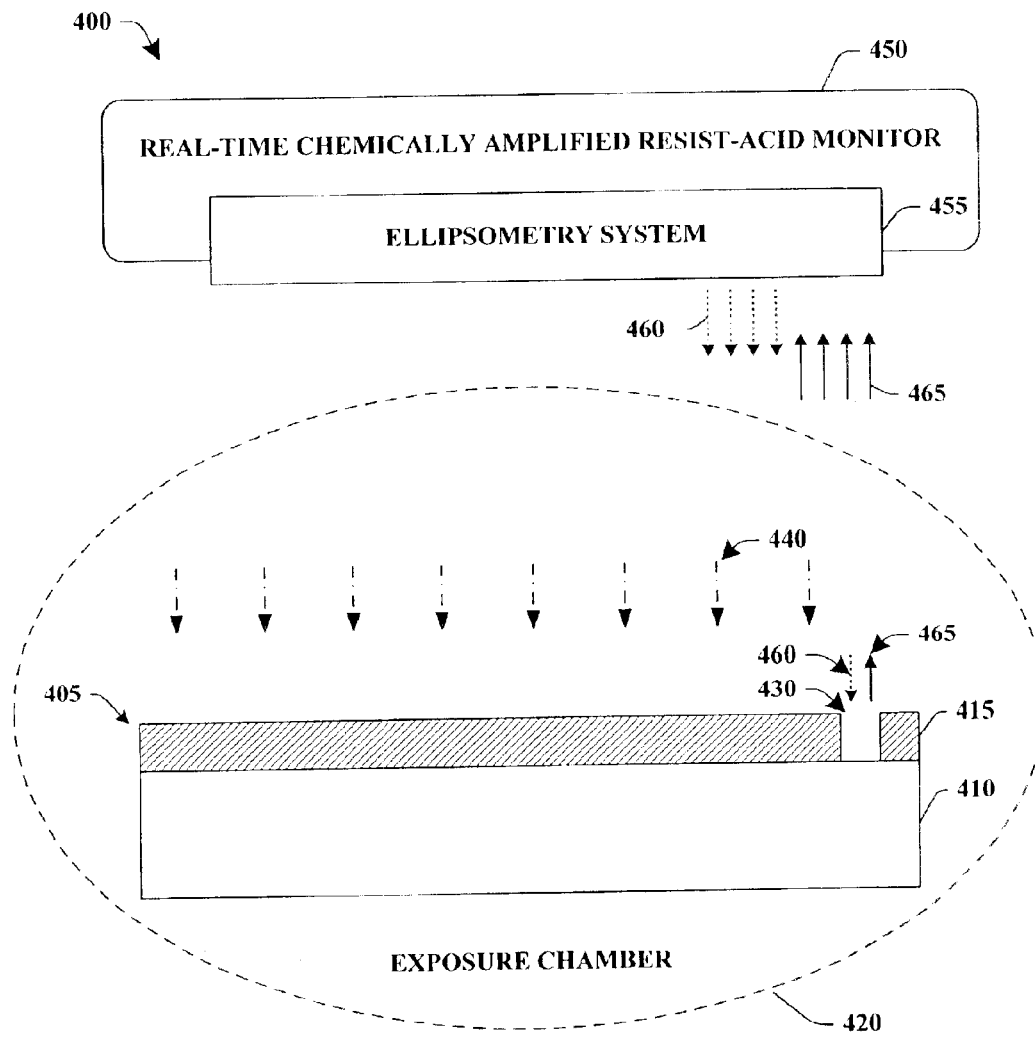
FIG. 4 illustrates a cross-sectional view of a schematic CAR-coated wafer undergoing an exposure process where in which the CAR coating is being monitored in real time so that the exposure process may be modified accordingly in real time in accordance with an aspect of the present invention.

FIG. 4 depicts a partial cross-sectional view of a system 400 for controlling environmental acid scavengers in real time during a pattern exposure process of a CAR. In particular, a wafer 405 having a substrate 410 and a CAR layer 415 formed thereover is located within an exposure chamber 420.

A first portion 430 of the resist layer 415 has been removed from the resist layer 415 to expose a surface of the wafer substrate 410. By removing a small portion of the resist layer 415, a probe area 430 has been created about which information relating to the resist layer 415 may be obtained.

Once the probe area 430 has been properly formed according to desired parameters, an exposure process may begin in order to transfer a device pattern to the resist layer 415. The exposure process and pattern transfer may be accomplished in part by irradiating 440 at least a second portion of the resist layer 415. It should be understood that the first portion 430 of the resist layer is smaller than the second portion of the resist layer 415.

While the exposure process takes place, a real-time CAR-acid monitor 450 may be employed to screen the environment within the exposure chamber for environmental acid scavengers such as amine groups. The monitor 450 can utilize an ellipsometry system 455, for example, in order to facilitate the screening, detection, and identification of any elements, compounds, chemicals, and the like found in the exposure environment. In particular the ellipsometry system 455 may direct one or more beams of incident light 460 from one or more light sources (not shown) at the resist layer 415, and specifically at the probe area 430. The arrows representing the incident light do not necessarily correspond to the number of beams being emitted from the light source.

Light 465 reflected from the resist layer 415, and in particular, from the probe area 430 may be received by the ellipsometry system 455 and by the monitor 450 as well. The reflected light 465 may indicate the presence of one or more elements, chemicals, and/or compounds present in and/or around the probe area 430 which may provide information as to the current state of the resist layer 415. The reflected light data may be processed and analyzed in order to determine the state of the resist layer 415 as well as the state of the environment surrounding the resist layer 415 which may affect the resist layer 415 as it progresses through the exposure process.

Data generated by the analysis can be fed back in a controlled manner to the exposure system via an exposure controller in order to implement one or more modifications to the exposure system. Imposing modifications to the exposure system in real time facilitates effective process control of the device pattern transfer to the resist layer 415 which maintains critical dimensions at target areas of the resist layer 415.

Figure 5:
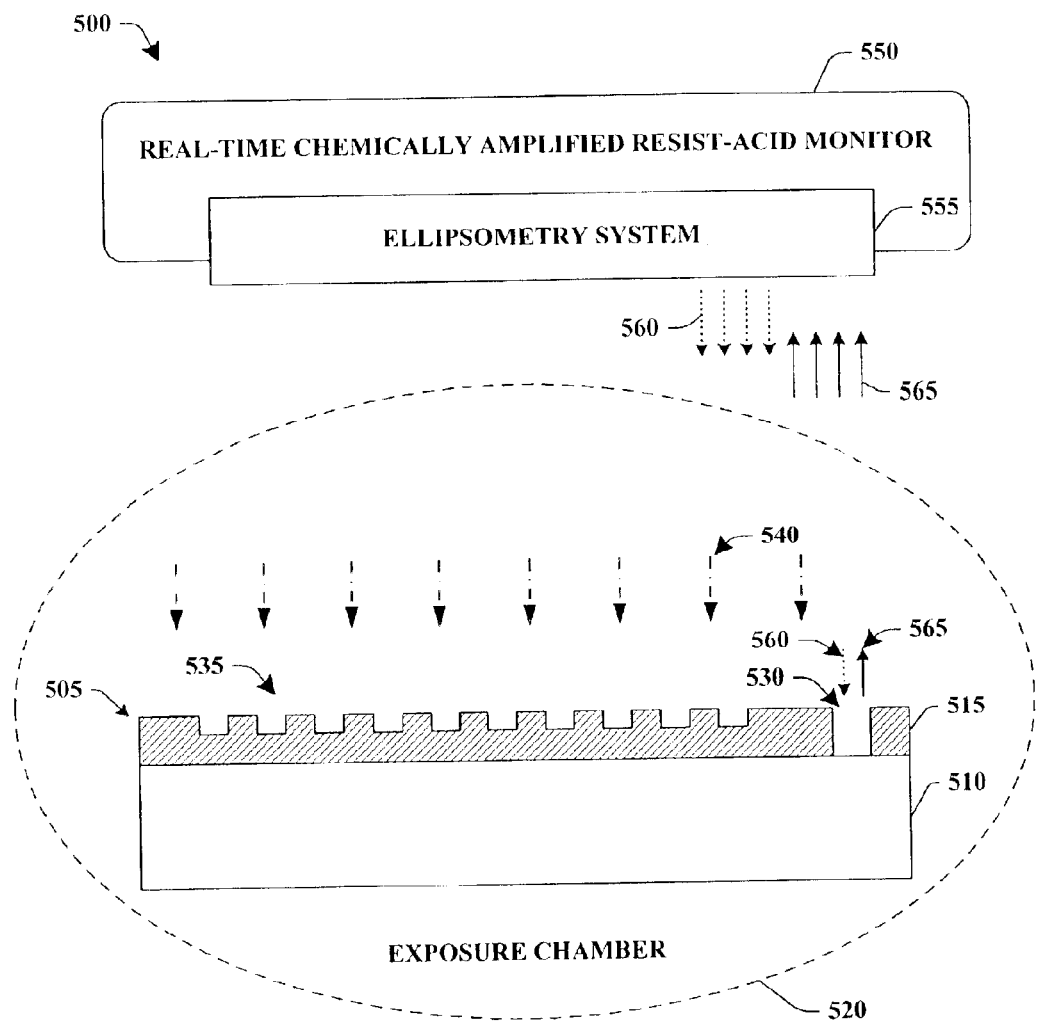
FIG. 5 illustrates a cross-sectional view of a schematic CAR-coated wafer undergoing an exposure process where in which the CAR coating is being monitored in real time so that the exposure process may be modified accordingly in real time in accordance with an aspect of the present invention.

FIG. 5 illustrates another aspect of a system 500 for controlling environmental acid scavengers in real time during a pattern exposure process of a CAR layer. The system includes a wafer structure 505 having a silicon substrate 510 and a CAR layer 515 formed thereon. A first portion of the CAR layer 515 may be removed in order to create a probe area 530 as described above with respect to FIG. 4.

The wafer structure 505 is shown undergoing an exposure process within an exposure chamber 520. The exposure process involves transferring a device pattern 535 onto the CAR layer 515. As can be seen in FIG. 5, the device pattern 535 has been partially transferred to the CAR layer 515 via irradiation 540. In order to maintain and optimize process control of the on-going exposure process, the exposure environment in and/or around the CAR layer 515 can be monitored by a real time CAR-acid monitor 550. In particular, the probe area 530 of the CAR layer 515 may primarily be monitored in order to ascertain the current or present environmental conditions. For example, the monitor 550 may employ an ellipsometer 555 (ellipsometry system) in order to detect one or more chemical signals at about the probe area 530 of the CAR layer 515. The conditions of the probe area 530 can represent the overall conditions for the CAR layer 515 in general.

The ellipsometer 555 directs incident light 560 at the probe area 530 and receives light reflected therefrom (565). The reflected light correlates to identifiable chemical compounds, elements and the like. In addition, the quantity or concentration in the parts-per-billion range of each identified element or compound may also be determined according to the reflected light data.

Because the presence of acid scavengers detected at about the probe area 530 may result in detrimental effects to the structural and/or physical integrity of the CAR layer 515 throughout the exposure process, adjustments to the exposure process and system may be warranted in order to mitigate such detrimental effects and in order to maintain the desired critical dimensions of the (patterned) CAR layer 515 despite the detection of acid scavengers. This may be accomplished in part by communicating the information gathered about the probe area 530 by the monitor 550 to a processor for further analysis. The resulting data from the analysis can be transmitted to an exposure controller (not shown). The controller can determine what, if any, adjustments are warranted based on the data generated from the probe area 530 in order to effect a change in the current exposure process. In addition, the controller may signal for one or more elements to be injected into the exposure chamber in order to compensate and counteract the acid scavenging characteristics detected in the exposure environment without unduly damaging the wafer structure 505 and device pattern transfer onto the CAR layer 515. The monitoring of the CAR layer 515 may continue until after the exposure process has been substantially completed.

Figure 6:
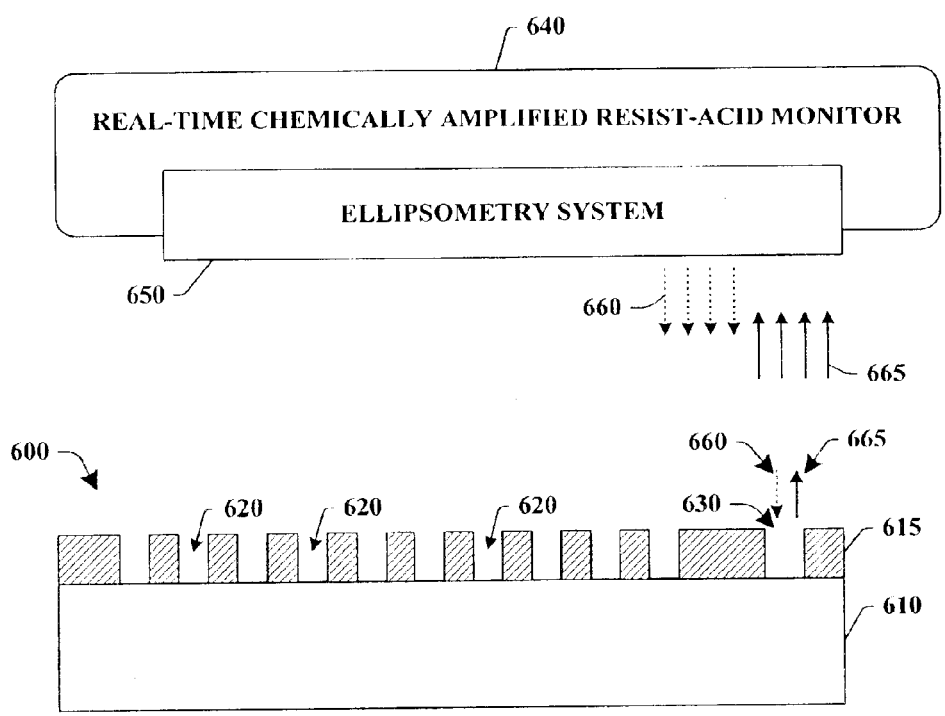
FIG. 6 illustrates a cross-sectional view of a schematic CAR-coated wafer after having undergone an exposure process in accordance with an aspect of the present invention.

For example, FIG. 6 depicts a wafer structure 600 having a patterned CAR layer 615 situated over a silicon substrate 610. As shown, the CAR layer 615 has a device pattern of features 620 properly formed therein. The patterned CAR layer 615 includes a probe area 630 as described above in FIGS. 4 and 5.

A real time CAR-acid monitor 640 continues to monitor the environment in and/or around the patterned CAR layer 615 by way of the probe area 630 even after the exposure process has been substantially completed in order to provide information about the CAR layer 615 in general. For example, a user may desire verification that the concentration of acid scavengers was maintained throughout the exposure process. In addition, it may be useful to the user to be aware that the concentration of acid scavengers either increased, decreased or stayed the same throughout, near and/or at the end of the exposure process. The monitor and/or processor systems may generate a graphical display depicting the contents of the exposure environment during the course of the exposure process as well as note when and which adjustments were made to the process.

The monitor 640 may employ an elliposometry system 650, for example. The ellipsometry system 650 directs light 660 at the probe area 630 and receives light data 665 reflected therefrom. The light data can be processed and analyzed similarly as described above in FIGS. 4 and 5.

Moreover, monitoring for environmental acid scavengers during the exposure process and providing feed back information (as it relates to the current state of the CAR layer) to the exposure process in real time facilitates obtaining the desired critical dimensions and the desired transfer of the device pattern. In addition, such monitoring optimizes process control such that variations among and between CAR-coated wafers may be readily accommodated and countered in order to produce substantially identical devices.

Figure 7:
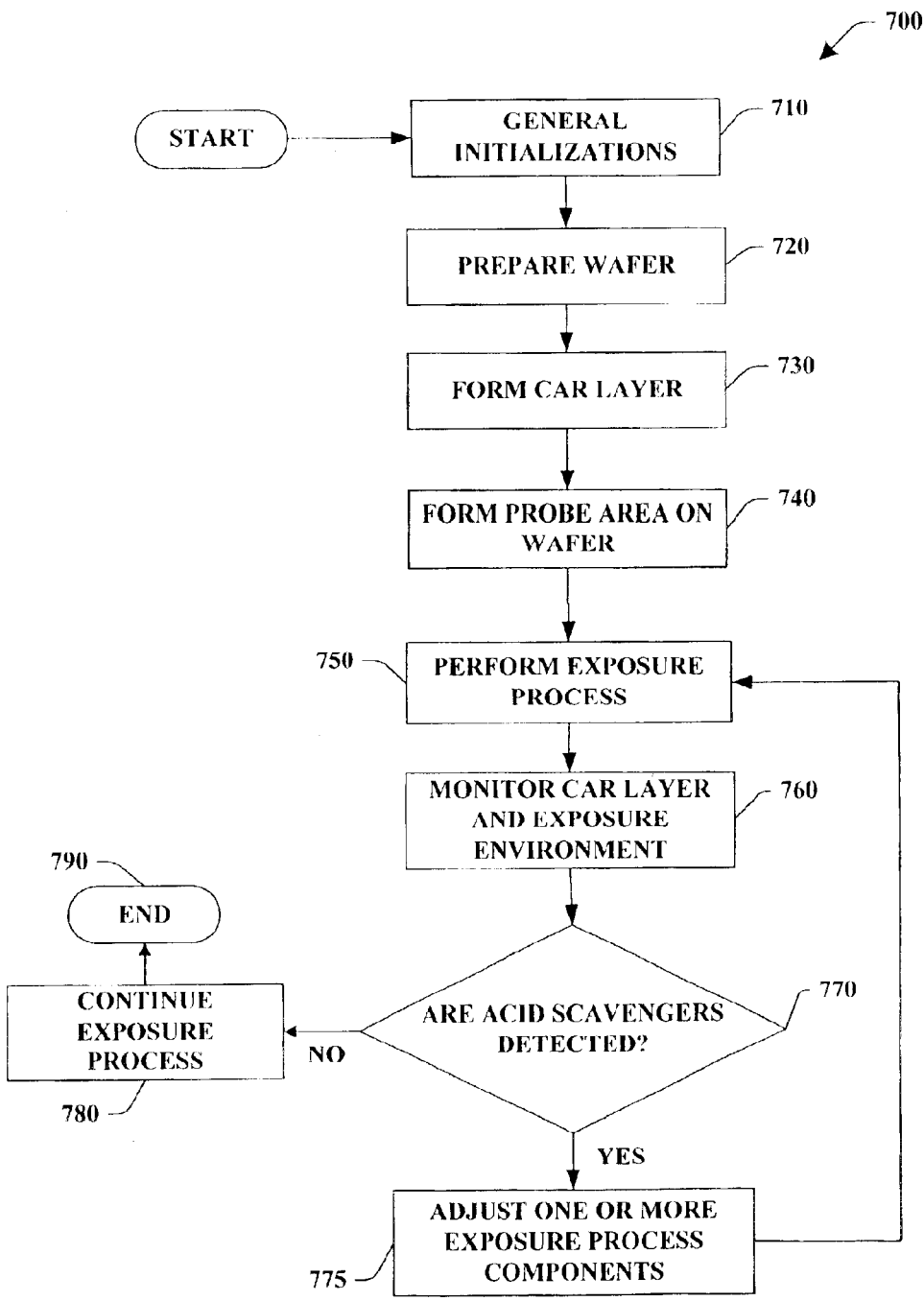
FIG. 7 illustrates a flow diagram of an exemplary method for controlling environmental acid scavengers during an exposure process for a CAR-coated wafer in real time in accordance with an aspect of the present invention

Turning now to FIG. 7 is illustrated a flow diagram of an exemplary method 700 for controlling environmental acid scavengers in real time during a pattern exposure process of a CAR layer. The method may begin with general initializations at 710. This can include preparing and cleaning the systems to be used as well as setting the appropriate parameters. A wafer may also be prepared at about 720 in order to undergo subsequent processing.

At about 730, a CAR layer may be formed or coated onto the wafer. In order to facilitate monitoring around and/or about the CAR layer, a first portion of the CAR layer may be removed in order to form a probe area at 740. The portion of the CAR layer is removed such that the substrate of the wafer is exposed. At 750, an exposure process may be initiated and performed with respect to the CAR layer in order to transfer a device pattern thereto. As the exposure process continues to progress, the CAR layer and/or its environment (e.g., exposure environment) may be monitored at 760 using any one of an ellipsometry, an IR spectrometer, and/or an UV spectrometer for the presence of chemical contaminants and/or chemical signals such as acid scavengers. If such chemical contaminants or signals at 770 are detected then one or more exposure process components may be adjusted immediately and in real time at 775 depending in part on the signals detected. The exposure process continues at 750 with the adjustments in effect. However, if no contaminants or signals are detected or if a threshold amount of the same has not been detected, then the exposure process continues at 780 without requiring any adjustments to its one or more components.

Although the invention has been shown and described with respect to several aspects, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including any reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A system for controlling environmental acid scavengers in real time during pattern exposure of a chemically amplified resist-clad wafer comprising:

a semiconductor wafer comprising a chemically amplified resist layer formed over a substrate layer and a probe area, the probe area comprising an area of the substrate layer exposed from removal of a first portion of the resist layer;

an exposure system programmed to implement an exposure process to transfer a device pattern onto at least a second portion of the chemically amplified resist layer; and a chemically amplified resist monitoring system adapted to detect chemical signals about the probe area in order to facilitate controlling the structural integrity of the resist layer during the exposure process.

2. The system of claim 1, wherein the first portion of the resist layer is smaller than the second portion of the resist layer.

3. The system of claim 1, further comprising an exposure controller operatively coupled to the monitoring system and the exposure system and adapted to implement one or more modifications to the exposure process based in part on the chemical signals detected about the probe area.

4. The system of claim 1, further comprising one or more exposure process components connected to the controller and designated to carry out the exposure process.

5. The system of claim 1, further comprising a processor coupled between the monitoring system and the controller which is employed to analyze the detected signals to facilitate determining whether the exposure process is to be adjusted.

6. The system of claim 1, wherein the monitoring system comprises any one of an ellipsometry system, an IR spectroscopy system, and an UV spectroscopy system to facilitate the detection of signals about the probe area of the resist layer.

7. The system of claim 1, further comprising feedback control such that analyzed information based in part on the detected signals is fed back to the exposure system in real time in order to effect immediate changes in a current exposure process.

8. The method of claim 1, wherein the exposure process and the monitoring system operate coincidentally and concurrently with respect to the other in real time.

9. A method for controlling environmental acid scavengers in real time during pattern exposure of a chemically amplified resist-clad wafer comprising:

providing a wafer having a chemically amplified resist layer formed thereon;

removing a first portion of the chemically amplified resist layer to reveal a surface of the wafer in order to create a probe area;

irradiating at least a second portion of the chemically amplified resist layer in order to transfer a device pattern therein; and monitoring an exposure environment with respect to the chemically amplified resist layer in order to determine a presence and amount of chemical contaminants about the probe area to facilitate controlling the structural integrity of the resist layer during the device pattern transfer.

10. The method of claim 9, further comprising:

using a measurement system to collect data from about the probe area; and using a processor to analyze the collected data in order to generate data results whereby such data results facilitate a visualization and a characterization of the resist layer during at least one segment of the exposure process.

11. The method of claim 10, wherein the data from about the probe area is collected and analyzed at least one time during the exposure process.

12. The method of claim 9, wherein the resist layer is monitored at least one time during the exposure process.

13. The method of claim 9, wherein the first portion of the resist layer is smaller than the second portion of the resist layer.

14. The method of claim 9, further comprising determining how to adjust the exposure system based in part on the determined amount of chemical contaminants in the exposure environment in order for the exposure process to compensate for the chemical contaminants.

15. The method of claim 9, further comprising adjusting one or more exposure process components via an exposure controller adapted to implement one or more modifications to the exposure process based in part on the chemical contaminants detected in the exposure environment.

16. The method of claim 15, wherein the one or more exposure process components are connected to the exposure controller, the components comprising at least one of temperature, pressure, flow rate, wavelength, and power.

17. The method of claim 9, wherein the exposure environment comprises any one of the probe area and the resist layer.

18. The method of claim 9, wherein the monitoring is performed by any one of an ellipsometry system, an IR spectroscopy system, and an UV spectroscopy system.

19. The method of claim 10, further comprising feeding the data results back to the exposure process in real time via feedback control in order to effect one or more immediate changes in the on-going exposure process.

20. The method of claim 9, wherein monitoring the exposure environment comprises: directing incident light at the probe area, receiving light reflected from the probe area; and transmitting the reflected light to a processor for analysis.

21. The method of claim 9, wherein the transfer of the device pattern and the monitoring of the exposure environment occur coincidentally and concurrently with respect to the other in real time.

22. A method for controlling environmental acid scavengers in real time during pattern exposure of a chemically amplified resist-clad wafer comprising:
provinding a wafer having a chemically amplified resist layer formed thereon;
removing a first portion of the chemically amplified resist layer to reveal a surface of the wafer in order to create a probe area;
performing an on-going exposure process to at least a second portion of the chemically amplified resist layer by irradiating the at least a second portion of the chemically amplified resist layer in order to transfer a device pattern therein;
monitoring an exposure environment with respect to the chemically amplified resist layer in order to determine a presence and amount of chemical contaminants about the probe area and to generate data relating thereto to facilitate controlling the structural integrity of the resist layer during the device pattern transfer, wherein the on-going exposure process and the monitoring of the exposure environment occur concurrently with respect to each other in real time; and
feeding the generated data back to the on-going exposure process in real time via feedback control in order to effect one or more immediate changes in the on-going exposure process.

* * * * *